(12) United States Patent
Danon et al.

(10) Patent No.: US 7,924,628 B2
(45) Date of Patent: Apr. 12, 2011

(54) OPERATION OF A NON-VOLATILE MEMORY ARRAY

(75) Inventors: Kobi Danon, Rishon Lezion (IL); Shai Eisen, Tel Aviv (IL); Marcelo Krygier, Kyriat Ono (IL)

(73) Assignee: Spansion Israel Ltd, Netanya (IL)

( * ) Notice: Subject to any disclaimer, the term of this patent is extended or adjusted under 35 U.S.C. 154(b) by 49 days.

(21) Appl. No.: 12/292,240

(22) Filed: Nov. 14, 2008

(65) Prior Publication Data
US 2009/0122610 A1    May 14, 2009

Related U.S. Application Data

(60) Provisional application No. 60/987,783, filed on Nov. 14, 2007.

(51) Int. Cl.
*G11C 16/04* (2006.01)
*G11C 16/06* (2006.01)
*G11C 7/10* (2006.01)
(52) U.S. Cl. .......... 365/185.28; 365/185.22; 365/189.05
(58) Field of Classification Search .............. 365/185.28
See application file for complete search history.

(56) References Cited

U.S. PATENT DOCUMENTS

| | | | |
|---|---|---|---|
| 5,768,192 A | 6/1998 | Eitan | |
| 5,822,245 A | 10/1998 | Gupta et al. | |
| 5,966,603 A | 10/1999 | Eitan | |
| 6,011,725 A | 1/2000 | Eitan | |
| 6,030,871 A | 2/2000 | Eitan | |
| 6,133,095 A | 10/2000 | Eitan et al. | |
| 6,215,148 B1 | 4/2001 | Eitan | |
| 6,233,180 B1 | 5/2001 | Eitan et al. | |
| 6,285,574 B1 | 9/2001 | Eitan | |
| 6,292,394 B1 | 9/2001 | Cohen et al. | |
| 6,396,741 B1 | 5/2002 | Bloom et al. | |
| 6,448,750 B1 | 9/2002 | Shor et al. | |
| 6,477,084 B1 | 11/2002 | Eitan | |
| 6,490,204 B2 | 12/2002 | Bloom et al. | |
| 6,552,387 B1 | 4/2003 | Eitan | |
| 6,583,007 B1 | 6/2003 | Eitan | |
| 6,633,496 B2 | 10/2003 | Maayan et al. | |
| 6,636,440 B2 | 10/2003 | Maayan et al. | |

(Continued)

FOREIGN PATENT DOCUMENTS

EP        1443521        8/2004

(Continued)

OTHER PUBLICATIONS

Flash Memory Trends & Perspectives, Geoffrey MacGillivray, Semiconductor Insights. 2006 Flash Memory Summit.

*Primary Examiner* — Son L Mai
(74) *Attorney, Agent, or Firm* — Eitan Mehulal Law Group

(57) ABSTRACT

A cache programming operation which requires 2 SRAMs (one for the user and one for the array) may be combined with a multi-level cell (MLC) programming operation which also requires 2 SRAMs (one for caching the data and one for verifying the data), using only a total of two SRAMs (or buffers). One of the buffers (User SRAM) receives and stores user data. The other of the two buffers (Cache SRAM) may perform a caching function as well as a verify function. In this manner, if a program operation fails, the user can have its original data back so that he can try to reprogram it to a different place (address).

17 Claims, 8 Drawing Sheets

U.S. PATENT DOCUMENTS

| | | |
|---|---|---|
| 6,643,181 B2 | 11/2003 | Sofer et al. |
| 6,649,972 B2 | 11/2003 | Eitan |
| 6,671,204 B2 | 12/2003 | Im |
| 6,707,719 B2 | 3/2004 | Shibata et al. |
| 6,798,697 B2 * | 9/2004 | Hosono et al. ........... 365/185.12 |
| 6,954,393 B2 | 10/2005 | Lusky et al. |
| 6,963,509 B1 | 11/2005 | Ju |
| 6,967,896 B2 | 11/2005 | Eisen et al. |
| 7,062,619 B2 | 6/2006 | Dvir et al. |
| 7,173,863 B2 | 2/2007 | Conley et al. |
| 7,274,595 B2 * | 9/2007 | Deml et al. .............. 365/185.12 |
| 7,301,825 B2 * | 11/2007 | Seong et al. ........... 365/189.011 |
| 2003/0016562 A1 | 1/2003 | Im |
| 2003/0117856 A1 | 6/2003 | Lee et al. |
| 2003/0174555 A1 | 9/2003 | Conley et al. |

FOREIGN PATENT DOCUMENTS

| | | |
|---|---|---|
| EP | 1280161 | 1/2006 |

* cited by examiner

OPERATION OF A NON-VOLATILE MEMORY ARRAY

CROSS-REFERENCE(S) TO RELATED APPLICATION(S)

This application claims priority from U.S. Provisional Patent Application No. 60/987,783 filed Nov. 14, 2007 and hereby incorporated by reference in its entirety.

TECHNICAL FIELD

The present invention relates generally to mass storage devices, and particularly to operating an array of non-volatile memory (NVM) cell arrays using cache programming and multi-level programming.

BACKGROUND

Programming data into a non-volatile memory (NVM) mass storage device (sometimes referred to as "writing") usually comprises increasing the threshold voltage (Vt) of selected NVM cells in an array, wherein different threshold voltages are associated with different program levels, such as "11", "01", "00", and "10". Programming these bits typically comprises asserting one or more programming pulses, each increasing a given NVM cell's Vt by a small increment, followed by a verification phase in which the bits are read to determine (verify) whether the cells have been successfully programmed. Multiple cycles of program pulses followed by verify may be needed to complete programming all the bits.
Program/Verify Cycle Programming is typically performed in increments, with pulses of voltage—after each pulse, a verify operation occurs in which the threshold voltage level of the cell is measured (read). The general idea is to "nudge" the threshold voltage to the desired level, rather than over-shooting (over programming) or under-shooting (under programming) the desired level. With appropriate control mechanisms, only a few pulses (nudges) are required. A similar concept of cycles of pulse followed by verify until a desired Vt has been attained may sometimes be used during the erase operation, to avoid under-erase or over-erase. See, for example, commonly-owned U.S. Pat. Nos. 6,292,394; 6,396,741; 6,490,204; 6,552,387; 6,636,440; and 6,643,181.
Multi-Level Programming In modern NVM memory cells, four or more program levels are possible, representing for example, binary "00" (zero), binary "01" (one), binary "10" (two) and binary "11" (three). This (having more than two program levels) is referred to as "multi-level programming" (MLC), and exemplary threshold voltages representing these four program levels might be, for example:

the center value for "11" equals approximately 4.0 volts
the center value for "01" equals approximately 4.4 volts
the center value for "00" equals approximately 4.8 volts
the center value for "10" equals approximately 5.4 volts Thus, it is evident that multi-level programming is much more "sensitive" than single level programming and, when reading the contents of a memory cell, small changes or differences in measured voltage can lead to erroneous results.

An MLC programming algorithm may include 2 phases, which may generally be referred to here as "Phase 1" and "Phase 2", each phase operating like a normal two bit programming algorithm. For example, in Phase 1, which may be considered to be a "rough" phase, user data may quickly be programmed, in a series of "rough" increments, to an initial level (Vi) which is below a target level (Vt). Once all the data is above the initial level (Vi), in the second phase (Phase 2), the same data may be programmed again (or "re-programmed") to the target levels (Vts), which may be considered to be a "fine" phase. In Phase 2, some of the cells will already be at the target level from the Phase 1 programming, and may not need to be re-programmed. Because of the two phases, the programming operation requires two (2) buffers, and each of the two buffers may be implemented in SRAM. These 2 buffers are required on top of the cache programming functionality requirement for 2 buffers as well.

It may be appreciated that although everything could be done in a single (one) phase of fine increments, the two phase approach (rough increments followed by fine increments) can achieve the desired Vts without overshooting more efficiently and more quickly.
Cache Operation Cache programming generally refers to the practice of putting a cache memory before the memory array. Otherwise referred to as "pipelining", a page of data may be input to a cache register, then this data is transferred to a data register when a cache programming command is issued. When the transfer is complete, the cache register is available to receive new data input, while the data register simultaneously programs the memory array.

A normal cache programming operation requires two buffers, one working with the user and the other working with the array. The data to be programmed to the NVM array is loaded by the user (which may be a software application) and temporarily stored in a volatile data buffer such as an SRAM array. After applying a programming pulse, the data read out from the NVM array is usually stored in a second volatile buffer, and program verification is carried out by comparing the data of the two buffers (the original data to be programmed and the temporarily read out data).

Cache programming may use a page-size cache register to program pages of data within a block. In the standard page program operation, the device has to finish programming the data into the memory array before a new page can be programmed. The advantage of the cache program operation is that it allows new data to be input while the previous data, that was transferred to the page buffer, is programmed into the memory array.

U.S. Pat. No. 6,963,509 discloses a page buffer having dual register. A data transmission path is formed by installing switching units so that a main register, as well as a cache register, can be directly provided with a data. Therefore, a program operation is performed directly by using the main register in a normal program operation, and by using the cache register in a cache program operation.

US 20030174555 discloses a method and structure for data verification operation for non-volatile memories. A flash EEPROM memory-based storage subsystem includes one or more flash memory arrays, each with three data registers and a controller circuit. During a flash program operation, one data register is used to control the program operation, a second register is used to hold the target data value, and a third register is used to load the next sector's data. Subsequent to a flash program operation, a sector's data are read from a flash array into the first data register and compared to the target data stored in the second register. When the data is verified good, the data from the third register is copied into the first and second registers for the next program operation.
Programming Multi-Level Cells FIGS. 1A and 1B illustrate threshold voltage (Vt) distributions for the erase state ("11") and three program states ("01", "00", "10"). The horizontal axis is threshold voltage (Vt), and the vertical axis is the number of cells at various Vt's.

With multi-level programming, the separations between threshold voltages for the different program levels (including, erase state) are relatively close together. Therefore, for purposes of efficiency, bits may first be programmed coarsely (in relatively large steps) in a first phase of programming ("Phase 1"), then in a second phase of programming ("Phase 2") the bits are moved in smaller steps to the desired Vt.

FIG. 1A illustrates a first phase (Phase 1) of programming. Programming proceeds in coarse (rough) steps to get all of the non-erased bits ("01", "00", "10") above an initial threshold voltage (Vi) which is chosen to be slightly less than the lowest Vt for non-erased bits. As can readily be seen, many of the bits may have Vts which are overlapping at this point. And, as will be evident from a comparison with the next diagram (FIG. 1B), some of the bits may have reached their final Vt in Phase 1. It should be understood that FIG. 1A is greatly simplified, for illustrative clarity, and there is a Vi threshold per level (not only for the "01" state, as illustrated)—similar to what is shown in FIG. 1B. Also, V1, V2, V3 are omitted, and would be placed accordingly (similar to FIG. 1B).

FIG. 1B illustrates a second phase (Phase 2) of programming. Programming proceeds in smaller (fine) steps to get all of the non-erased bits ("01", "00", "10") above their respective "verify" voltages, represented here as V1 (for the "01" bits), V2 (for the "00" bits) and V3 (for the "10" bits). Also shown in this diagram are read voltages R1, R2 and R3 for the respective "01", "00" and "10" bits. The read voltage (R1, R2, R3) for a given program level is established to be slightly below the verify voltage (V1, V2, V3) for the given program level. (The read levels are typically slightly below the verify voltages to overcome retention phenomena.)

An illustration of a two-phase scheme to reduce programming time may be found at page 11 of Flash Memory Trends & Perspectives, Geoffrey MacGillivray, Semiconductor Insights, 2006.

Data Scrambling

A problem with writing to (programming) memory cells is that as data (and new data) is written to a group of memory cells, individual ones of the cells may be programmed more (more times) than others. Such a lack of uniformity can cause difficulties when operating the memory cells, particularly with MLC operation of memory cells. In other words, if a given memory cell (or half cell) has been subjected to a different number of programming operations (injection of electrons to raise the threshold voltage) than other cells, it can become "over-programmed" and will tend to operate differently than other cells, and is likely to lead to problems in accurately reading the contents of the cell. A problem can also be encountered during the Erase operation: Non-programmed cells may get over-erased.

One solution to the problem is to perform program before erase (PBE) on all of the cells (or half cells) being erased. This procedure, referred to as "full PBE", is simple and effective, and ensures an even program rate (uniformity). However, it takes a lot of time to perform the program operation (such as injection of electrons into the charge storage or trapping area of the memory cell). In addition to the "full PBE" there is the option of "sparse PBE", wherein each time a different group of cells is programmed.

Another solution to the problem is to scramble the data ("data scrambling"). This means changing ones to zeros in an organized manner so that all cells will be subject to the same number of 1s and 0s, within a statistically valid range. This also ensures an even program rate (uniformity).

Data scrambling may be achieved by doing an invert on each bit, according to a scrambling pattern. When being read, the data is unscrambled, using the same pattern. The pattern is the "key".

Data scrambling strives to ensure a more even distribution of 1s and 0s being written ("even program rate"), even if the data for a given cell (or half cell) is repeatedly being written at one programming level (usually a binary 0). For example, if a given memory cell (or half cell) is being targeted for programming repeatedly with binary 0 (due to the data for that bit being programmed not changing over a number of program cycles), data scrambling will cause it to be programmed sometimes with a 0 and sometimes with a 1 (which may be defined as the erase state).

The goal of data scrambling is to make uniform the number of times that a given cell (or half-cell) is programmed to a given program, or voltage, level). Another way of referring to such data scrambling is "balancing the content to be programmed", or "balancing the programming rate".

Commonly-Owned Patents, and Publications

Commonly-owned patents disclose structure and operation of NROM and related ONO memory cells. Some examples may be found in commonly-owned U.S. Pat. Nos. 5,768,192, 6,011,725, 6,649,972 and 6,552,387.

Commonly-owned patents disclose architectural aspects of an NROM and related ONO array, (some of which have application to other types of NVM array) such as segmentation of the array to handle disruption in its operation, and symmetric architecture and non-symmetric architecture for specific products, as well as the use of NROM and other NVM array(s) related to a virtual ground array. Some examples may be found in commonly-owned U.S. Pat. Nos. 5,963,465, 6,285,574 and 6,633,496.

Commonly-owned patents also disclose additional aspects at the architecture level, including peripheral circuits that may be used to control an NROM array, or the like. Some examples may be found in commonly-owned U.S. Pat. Nos. 6,233,180, and 6,448,750.

Commonly-owned patents also disclose several methods of operation of NROM and similar arrays, such as algorithms related to programming, erasing, and/or reading such arrays. Some examples may be found in commonly-owned U.S. Pat. Nos. 6,215,148, 6,292,394 and 6,477,084.

Commonly-owned patents also disclose manufacturing processes, such as the process of forming a thin nitride layer that traps hot electrons as they are injected into the nitride layer. Some examples may be found in commonly-owned U.S. Pat. Nos. 5,966,603, 6,030,871, 6,133,095 and 6,583,007.

Commonly-owned patents also disclose algorithms and methods of operation for each segment or technological application, such as: fast programming methodologies in all flash memory segments, with particular focus on the data flash segment, smart programming algorithms in the code flash and EEPROM segments, and a single device containing a combination of data flash, code flash, and/or EEPROM. Some examples may be found in commonly-owned U.S. Pat. Nos. 6,954,393 and 6,967,896.

Where applicable, descriptions involving NROM are intended specifically to include related oxide-nitride technologies, including SONOS (Silicon-Oxide-Nitride-Oxide-Silicon), MNOS (Metal-Nitride-Oxide-Silicon), MONOS (Metal-Oxide-Nitride-Oxide-Silicon), and the like, used for NVM devices. Further descriptions of NVM and related technologies may be found at "Non Volatile Memory Technology", Vol. 1 & 2 (2005), Vol. 3 (2006) and Vol. 4 (2007), published by Saifun Semiconductor; "Microchip Fabrication", by Peter Van Zant, 5$^{th}$ Edition 2004; "Application-Specific Integrated Circuits" by Michael John Sebastian Smith, 1997; "Semiconductor and Electronic Devices", by Adir Bar-Lev, 2$^{nd}$ Edition, 1999; "Digital Integrated Circuits" by Jan M. Rabaey, Anantha Chandrakasan and Borivoje Nikolic, 2$^{nd}$ Edition, 2002 and materials presented at and through http://siliconnexus.com, "Design Considerations in Scaled SONOS Nonvolatile Memory Devices" found at:

http://klabs.org/richcontent/MemoryContent/nvmt_symp/ nvmts_2000/presentations/bu_white_sono s_lehigh_univ.pdf, "SONOS Nonvolatile Semiconductor Memories for Space and Military Applications" found at:

http://klabs.org/richcontent/MemoryContent/nvmt_symp/ nvmts_2000/papers/adams_d.pdf, "Philips Research-Technologies-Embedded Nonvolatile Memories" found at:

http://www.research.philips.com/technologies/ics/nvmemories/index.html, and "Semiconductor Memory: Non-Volatile Memory (NVM)" found at:

http://www.ece.nus.edu.sg/stfpage/elezhucx/myweb/ NVM.pdf, all of which are incorporated by reference herein in their entirety.

Glossary

Unless otherwise noted, or as may be evident from the context of their usage, any terms, abbreviations, acronyms or scientific symbols and notations used herein are to be given their ordinary meaning in the technical discipline to which the disclosure most nearly pertains. The following terms, abbreviations and acronyms may be used throughout the descriptions presented herein and should generally be given the following meaning unless contradicted or elaborated upon by other descriptions set forth herein. Some of the terms set forth below may be registered trademarks (®).

When glossary terms (such as abbreviations) are used in the description, no distinction should be made between the use of capital (uppercase) and lowercase letters. For example "ABC", "abc" and "Abc", or any other combination of upper and lower case letters with these 3 letters in the same order, should be considered to have the same meaning as one another, unless indicated or explicitly stated to be otherwise. The same commonality generally applies to glossary terms (such as abbreviations) which include subscripts, which may appear with or without subscripts, such as "$X_{yz}$" and "Xyz". Additionally, plurals of glossary terms may or may not include an apostrophe before the final "s"—for example, ABCs or ABC's.

algorithm In mathematics, computing, linguistics, and related disciplines, an algorithm is a definite list of well-defined instructions for completing a task; that given an initial state, will proceed through a well-defined series of successive states, eventually terminating in an end-state.

array memory cells may optionally be organized in an array of rows and columns, and may be connected to selected bit lines and word lines in the array.

The array may be organized into various logical sections containing pluralities of memory cells, such as blocks, pages and sectors. Some of these sections may be physically isolated and operated independently from one another.

BER short for bit error rate. In telecommunication, an error ratio is the ratio of the number of bits, elements, characters, or blocks incorrectly received to the total number of bits, elements, characters, or blocks sent during a specified time interval. The most commonly encountered ratio is the bit error ratio (BER)—also sometimes referred to as bit error rate.

binary system The binary numeral system, or base-2 number system, is a numeral system that represents numeric values using only two symbols, usually "0" and "1". Owing to its straightforward implementation in electronic circuitry, the binary system is used internally by virtually all modern computers. Many 1s and 0s can be strung together to represent larger numbers. Starting at the right is the "place" for "ones", and there can be either 0 or 1 one's. The next "place" to the left is for "twos", and there can be either 0 or 1 0 two's. The next "place" to the left is for "fours", and there can be either 0 or 1 0 fours. The next "place" to the left is for "eights", and there can be either 0 or 1 0 eights. This continues for as many places as desired, typically 4, 8, 16, 32 or 64 places. For example, 0000 represents zero (a "0" in all four places)

0001 represents one (a "1" in the ones place, and 0s in all of the other three places)

0010 represents two (a "1" in the twos place, and 0s in the other three places)

0011 represents three (a "1" in the ones place, plus a "1" in the twos place)

0100 represents four (a "1" in the fours place, and 0s in all of the other three places)

1000 represents eight (a "1" in the eights place, and 0s in all of the other three places)

1010 represents ten (a "1" in the ones place, plus a "1" in the twos place)

In binary notation, each "place" to the left of the first (ones) place has a possible value of either 0 or, if there is a "1" in the place, two times the value of the place immediately to the right. Hence, from right (least significant bit) to left (most significant bit), the places have a value of either 0 or 1, 2, 4, 8, 16, 32, 64, 128, and so forth.

Generally, counting in binary begins with "zero", rather than with "one", as we are accustomed to. For example, four items could be counted as follows: "zero" (00), "one" (01), "two" (10), "three" (11).

bit The word "bit" is a shortening of the words "binary digit." A bit refers to a digit in the binary numeral system (base 2). A given bit is either a binary "1" or "0". For example, the number 1001011 is 7 bits long. The unit is sometimes abbreviated to "b". Terms for large quantities of bits can be formed using the standard range of prefixes, such as kilobit (Kbit), megabit (Mbit) and gigabit (Gbit). A typical unit of 8 bits is called a Byte, and the basic unit for 128 Bytes to 16K Bytes is treated as a "page". That is the "mathematical" definition of "bit". In some cases, the actual (physical) left and right charge storage areas of an NROM cell are conveniently referred to as the left "bit" and the right "bit", even though they may store more than one binary bit (with MLC, each storage area can store at least two binary bits). The intended meaning of "bit" (mathematical or physical) should be apparent from the context in which it is used.

byte A byte is commonly used as a unit of storage measurement in computers, regardless of the type of data being stored. It is also one of the basic integral data types in many programming languages. A byte is a contiguous sequence of a fixed number of binary bits. In recent years, the use of a byte to mean 8 bits is nearly ubiquitous. The unit is sometimes abbreviated to "B". Terms for large quantities of Bytes can be formed using the standard range of prefixes, for example, kilobyte (KB), megabyte (MB) and gigabyte (GB).

cache In computer science, a cache is a collection of data duplicating original values stored elsewhere or computed earlier, where the original data is expensive to fetch (due to longer access time) or to compute, compared to the cost of reading the cache. In other words, a cache is a temporary storage area where, for example, frequently accessed data can be stored for rapid access. Once the data is stored in the cache, future use can be made by accessing the cached copy rather than re-fetching or recomputing the original data, so that the average access time is shorter.

cell the term "cell" may be used to describe anything, such as an NVM cell, that can store one unit of analog data. This includes FG memory cells, and non-FG memory cells, such as NROM. See half cell.

distribution overlap A number of cells programmed at a given program level may exhibit a distribution of threshold voltages. Usually, the distribution for one program level is separated from a distribution for another program level. However, due to threshold drift, one or both of the distributions may move towards the other, causing some of the threshold voltages to be the same. The region where the threshold voltages are the same for cells programmed at two different program levels is the distribution overlap.

disturb When applying a pulse to a specific bit by raising WL and BL voltages, neighboring bits located on the same WL or same BL might suffer from Vt shift that cause margin loss. The shift is called "disturb". Disturbs are a fault type where the content of a cell is unintentionally altered when operating on another cell. These faults have similar characteristics to coupling faults, however, they have special neighborhood requirements.

Disturb faults are generally caused by the presence of high/intermediate electric field stress on an insulating layer within the core memory cell. This electric field results in leakage current caused either by FN-tunneling, punchthrough, or channel hot electron injection. Whether a given mechanism is responsible for a particular disturb is a function of the operating conditions and the state of the investigated cell.

The IEEE Standard Definition and Characterization of Floating Gate Semiconductor Arrays disturb faults can be divided into the following:

Word-line erase disturb (WED): Exists when a cell under program (selected cell) causes another unprogrammed cell (unselected cell), sharing the same wordline, to be erased.

Word-line program disturb (WPD): Exists when a cell under program (selected cell) causes another unprogrammed cell (unselected cell), sharing the same wordline, to be programmed.

Bit-line erase disturb (BED): Exists when a cell under program (selected cell) causes another unprogrammed cell (unselected cell), sharing the same bit-line, to be erased.

Bit-line program disturb (BPD): Exists when a cell under program (selected cell) causes another unprogrammed cell (unselected cell), sharing the same bitline, to be programmed.

Read disturb (RD): During read operation, the bias conditions are the same as programming conditions (except for lower voltage magnitudes) and can result in the injection of electrons from drain to FG, thus programming the selected cell. This is known as a soft program. In addition, unselected erased cells may become programmed, and those that are programmed may become erased, giving rise to what is known as gate read erase and channel read program, respectively. Both of these disturbs that occur on un-addressed cells are considered to be another form of read disturbs.

ECC short for error correcting code. An error-correcting code (ECC) is a code in which each data signal conforms to specific rules of construction so that departures from this construction in the received signal can generally be automatically detected and corrected. It is used in computer data storage, for example in dynamic RAM, and in data transmission.

Some codes can correct a certain number of bit errors and only detect further numbers of bit errors. Codes which can correct one error are termed single error correcting (SEC), and those which detect two are termed double error detecting (DED). Hamming codes can correct single-bit errors and detect double-bit errors —SEC-DED. More sophisticated codes correct and detect even more errors.

An error-correcting code which corrects all errors of up to n bits correctly is also an error-detecting code which can detect at least all errors of up to 2n bits.

Two main categories are convolutional codes and block codes. Examples of the latter are Hamming code, BCH code, Reed-Solomon code, Reed-Muller code, Binary Golay code, and low-density parity-check codes.

ED bits as used herein, ED bits are numbers which may be calculated for and stored along with data being programmed (stored), which are indicative of the number of cells (or half-cells) at any given program level, for example, 512 cells (or half cells) at program level "10". During a subsequent read operation, the ED bits may be retrieved along with the data which was stored; the number of cells at the given program levels are counted, and these counts are compared with the ED bits. If there is a mismatch, this indicates a read error, and an error correction scheme such as "moving read reference" can be implemented. See moving read reference.

EEPROM short for electrically erasable, programmable read only memory. EEPROMs have the advantage of being able to selectively erase any part of the chip without the need to erase the entire chip and without the need to remove the chip from the circuit. The minimum erase unit is 1 Byte and more typically a full Page. While an erase and rewrite of a location appears nearly instantaneous to the user, the write process is usually slightly slower than the read process; the chip can usually be read at full system speeds.

endurance Because they are written by forcing electrons through a layer of electrical insulation onto a floating gate (or charge-trapping medium), some NVM cells can withstand only a limited number of write and erase cycles before the insulation is permanently damaged, and the ability of the cell to function correctly is compromised. In modern Flash EEPROM, the endurance may exceed 1,000,000 write/erase cycles.

EPROM short for erasable, programmable read only memory. EPROM is a memory cell in which information (data) can be erased and replaced with new information (data).

erase a method to erase data on a large set of bits in the array, such as by applying a voltage scheme that inject holes or remove electrons in the bit set. This method causes all bits to reach a low Vt level. See program and read.

Error Detection and Correction In computer science, telecommunication and information theory, error detection and correction has great practical importance in maintaining data (information) integrity across noisy channels and less-than-reliable storage media. More particularly, Error detection is the ability to detect the presence of errors caused by noise or other impairments during transmission from the transmitter to the receiver.

Error correction is the additional ability to reconstruct the original, error-free data.

FC short for flash (memory) cell.

FG short for floating gate. The floating-gate transistor is a kind of transistor that is commonly used for non-volatile storage such as flash, EPROM and EEPROM memory. Floating-gate transistors are almost always floating-gate MOSFETs. Floating-gate MOSFETs are useful because of their ability to store an electrical charge for extended periods of time even without a connection to a power supply.

Flash memory Flash memory is a form of non-volatile memory (EEPROM) that can be electrically erased and reprogrammed. Flash memory architecture allows multiple memory locations to be erased or written in one programming operation. Two common types of flash memory are NOR and NAND flash. NOR and NAND flash get their names from the structure of the interconnections between memory cells. In NOR flash, cells are connected in parallel to the bit lines, allowing cells to be read and programmed individually. The parallel connection of cells resembles the parallel connection of transistors in a CMOS NOR gate. In NAND flash, cells are connected in series, resembling a NAND gate, and preventing cells from being read and programmed individually: the cells connected in series must be read in series.

Some systems will use a combination of NOR and NAND memories, where a smaller NOR memory is used as software ROM, and a larger NAND memory is partitioned with a file system for use as a random access storage area. NAND is best suited to flash devices requiring high capacity data storage. This type of flash architecture combines higher storage space with faster erase, write, and read capabilities over the execute in place advantage of the NOR architecture. See NAND, NOR.

half cell "half cell" (or "half-cell") is a term which is sometimes used to refer to the two distinct charge storage areas (left and right "bits", or left and right "sides") of an NROM memory cell.

logical operators A logical connective, also called a truth-functional connective, logical operator or propositional operator, is a logical constant which represents a syntactic operation on a sentence, or the symbol for such an operation that corresponds to an operation on the logical values of those sentences. A logical connective serves to return (results in) a "true" or "false" value (such as binary "0" or binary "1") when applied to arguments (operators) also having true or false values. For example, some common logical operators are:

AND the AND operator results in a value of "true" only if both of the operands (A,B) have a value of "true". (in binary terms, if A="1" and B="1", then the result is "1". Otherwise, the result is "0".)

OR the OR operator results in a results in a value of "true" if one or the other, or both of the operands (A,B) has a value of "true". (in binary terms, if either one of A or B="1" and B="1", the result is "1". Otherwise, the result is "0".)

XOR short for exclusive "or". the XOR operator results in a value of "true" if and only if exactly one of the operands (A,B) has a value of "true". (in binary terms, if only one of A or B="1" and B="1", the result is "1". Otherwise, the result is "0".)

MLC short for multi-level cell. In the context of a floating gate (FG) memory cell, MLC means that at least two bits of information can be stored in the memory cell. In the context of an NROM memory cell, MLC means that at least four bits of information can be stored in the memory cell—at least two bits in each of the two charge storage areas.

moving read reference as used herein, "moving read reference" refers to a technique, such as disclosed in U.S. Pat. No. 6,992,932 wherein reference voltages are determined to be used in reading cells programmed to a given program state. Generally, if an error is detected, such as by using error detection (ED) bits, the reference voltages may have to be adjusted until the error is resolved. See ED bits.

NAND NAND flash architecture memories are accessed much like block devices such as hard disks or memory cards. The pages are typically 512 or 2,048 or 4,096 bytes in size. Associated with each page are usually a few bytes (typically 12-16 bytes) that are used for storage of an error detection (ED) and correction checksum. The pages are typically arranged in blocks, such as 32 pages of 512 bytes, 64 pages of 2,048 bytes, or 64 pages of 4,096 bytes. With NAND architecture, programming may be performed on a page basis, but erasure can only be performed on a block basis.

Most NAND devices are shipped from the factory with some bad blocks which are typically identified and marked according to a specified bad block marking strategy. The first physical block (block 0) is always guaranteed to be readable and free from errors. Hence, all vital pointers for partitioning and bad block management for the device are located inside this block (typically a pointer to the bad block tables). If the device is used for booting a system, this block may contain the master boot record.

NOR Reading from NOR flash is similar to reading from random-access memory, provided the address and data bus are mapped correctly. Because of this, most microprocessors can use NOR flash memory as execute in place (XIP) memory, meaning that programs stored in NOR flash can be executed directly without the need to copy them into RAM. NOR flash chips lack intrinsic bad block management, so when a flash block is worn out, the software or device driver controlling the device must handle this, or the device will cease to work reliably.

NROM short for nitride(d) read only memory. Generally, a FET-type device having a charge trapping medium such as a nitride layer for storing charges (electrons and holes) in two discrete areas, near the source and drain diffusions, respectively.

NVM short for non-volatile memory. NVM is computer memory that can retain the stored information even when not powered. Examples of non-volatile memory include read-only memory, flash memory, most types of magnetic computer storage devices (for example hard disks, floppy disk drives, and magnetic tape), optical disc drives, and early computer storage methods such as paper tape and punch cards. Non-volatile memory is typically used for the task of secondary storage, or long-term persistent storage. The most widely used form of primary storage today is a volatile form of random access memory (RAM), meaning that when the computer is shut down, anything contained in RAM is lost. Unfortunately most forms of non-volatile memory have limitations which make it unsuitable for use as primary storage. Typically non-volatile memory either costs more or performs worse than volatile random access memory. (By analogy, the simplest form of an NVM memory cell is a simple light switch. Indeed, such a switch can be set to one of two (binary) positions, and can "memorize" that position.) NVM includes floating gate (FG) devices and NROM devices, as well a devices using optical, magnetic and phase change properties of materials.

ONO short for oxide-nitride-oxide. ONO is used as a charge storage insulator consisting of a sandwich of thermally insulating oxide, and charge-trapping nitride.

over-erase a condition that happens to some bits in a large bit set that are erased together, due to erase speed difference, due to the situation that some bits erase faster than other bits. Fast bits are particularly susceptible to over-erase. See erase.

PAE short for program after erase. PAE is useful to avoid cells that experienced over-erase and significant Vt reduction, to become leaky and cause read errors to all cells sharing the same bitlines.

page Generally, a grouping of memory cells can be termed a word, a grouping of words can be termed a page, and a grouping of pages can be termed a sector. Data may be accessed for reading and programming (or writing) by word or by page, while an entire sector is commonly accessed for erasing.

PBE short for program before erase. PBE is useful to bring cells to a more-or-less uniform level prior to performing an erase operation. Particularly, if a cell has been erased a number of times, it may otherwise end up with a negative Vt, which is generally undesirable.

program a method to program a bit in an array, by applying a voltage scheme that injects electrons. This method causes an increase in the Vt of the bit that is being programmed. Alternatively, with "high Vt erase", programming may be a lowering of the Vt of the memory cell. See erase and read. Program may sometimes, erroneously, be referred to as "write". See write.

program rate as used herein, "program rate" refers to the number of times that a memory cell (or half cell) is programmed to various program (or threshold voltage) levels, such as representing a binary "1" or "0".

program time refers to the duration of a single program pulse, or the duration of the whole program sequence algorithm to program a bit set.

programmed "programmed" generally means that the threshold voltage (Vt) of a cell is above a predetermined "program verify" level (Vth).

PROM short for programmable read-only memory.

RAM short for random access memory. RAM refers to data storage formats and equipment that allow the stored data to be accessed in any order—that is, at random, not just in sequence. In contrast, other types of memory devices (such as magnetic tapes, disks, and drums) can access data on the storage medium only in a predetermined order due to constraints in their mechanical design.

read a method to read the digital data stored in the array. The read operation is usually performed in "blocks" of several cells. See erase and program.

refresh a part of the program or erase algorithms that checks the status of bits and applies pulses to bits that may have lost some of their Vt due to reliability margin loss.

register In electronics, a register is a small amount of storage whose contents can be accessed more quickly than storage available elsewhere. Registers are normally measured by the number of bits they can hold, for example, an "8-bit register" or a "32-bit register". Registers are now usually implemented as a register file, but they have also been implemented using individual flip-flops.

retention Retention generally refers to the ability of a memory cell to retain charges inserted into the charge storage medium, such as a floating gate. The data retention of EPROM, EEPROM, and Flash may be limited by charge leaking from the floating gates of the memory cell transistors. Leakage is exacerbated at high temperatures or in high-radiation environments.

ROM short for read-only memory.

SA short for sense amplifier (or "sense amp"). A sense amplifier is generally used in conjunction with memory arrays to amplify a voltage coming off of a bit line. There are many versions of sense amplifiers used in memory chips.

sector a part of the array, usually larger than a page, which usually contains a few pages. A minimum erase might include a sector. For example:
Erase Sector (ES): Group of cells that are erased by single erase command
Physical Sector (PS): Group of ES connected by single grid of Word Lines (WL) and Bit Lines (BL), sharing same set of drivers.

SLC short for single level cell. In the context of a floating gate (FG) memory cell, SLC means that one bit of information can be stored in the memory cell. In the context of an NROM memory cell, SLC means that at least two bits of information can be stored in the memory cell.

SRAM short for static random access memory. SRAM is a type of semiconductor memory. The word "static" indicates that the memory retains its contents as long as power remains applied, unlike dynamic RAM (DRAM) that needs to be periodically refreshed (nevertheless, SRAM should not be confused with read-only memory and flash memory, since it is volatile memory and preserves data only while power is continuously applied). SRAM should not be confused with SDRAM, which stands for synchronous DRAM and is entirely different from SRAM, or with pseudostatic RAM (PSRAM), which is DRAM configured to function, to an extent, as SRAM.

verify a read operation after applying a program or erase pulse, that checks if the applied program or erase pulse moved the Vt to the target level (program-verify or erase-verify level)

virtual ground array a topological architecture of memory cells where there is an electrical connection between neighboring cells.

V short for voltage. Different voltages may be applied to different parts of a transistor or memory cell to control its operation, such as:
Vb short for bulk (or substrate) voltage
Vd short for drain voltage
Vg short for gate voltage
Vs short for source voltage
Vt short for threshold voltage wear leveling Wear levelling (also written wear leveling) refers to a technique for prolonging the service life of some kinds of erasable computer storage media, such as flash memory. EEPROM and flash memory media have individually erasable segments, each of which can be put through a finite number of erase cycles before becoming unreliable. This can be anywhere between 10,000 and 1,000,000 cycles, for example, for NAND flash devices. Wear-levelling attempts to work around these limitations by arranging data so that erasures and re-writes are distributed evenly across the medium. In this way, no single sector prematurely fails due to a high concentration of write cycles.

write a combined method usually involving first erasing a large set of bits, then programming new data into the bit set; the erase step is not required but it is customary. See erase and program.

DESCRIPTION (SUMMARY)

According to some embodiments of the present invention, there is provided a non-volatile memory ("NVM") device comprising including a first buffer adapted to receive data from an interface, a second buffer adapted to receive data derived from data in said first buffer, and control logic adapted to program an NVM array using data in the second buffer, wherein programming of the NVM array may include modifying data in the second buffer during a first phase of programming and refreshing data in the second buffer with at least some data from said first buffer prior to a second phase of programming.

The first buffer may be adapted to receive data from the external interface while the control logic is engaged in a second phase of programming. The first buffer may be comprised of SRAM. The second buffer may be comprised of SRAM.

According to some embodiments of the present invention, as part of the first phase of programming, the control logic may be adapted to initiate a cycle of programming pulses followed by program verify operations. The control logic may be adapted to terminate a first phase of programming once NVM cells in the NVM array reach a first given threshold voltage. The control logic may be adapted to initiate a second phase of programming in order to raise the threshold voltage of NVM cells in the NVM array to a second given threshold voltage greater than the first given threshold voltage.

In the event the first phase programming fails, the control logic may initiate another first phase programming session by refreshing the said second buffer with data derived from data in said first buffer and programming a new NVM array address.

The control logic may be further adapted to scramble data being written to the second buffer from said first buffer.

The disclosure generally relates to a method for improved operation of an NVM memory array, limiting the number of internal buffers, which may realize die size savings and increase product performance. The techniques disclosed herein provide data flow management which enables support of a multi-level programming algorithm and cache programming.

More particularly, the disclosure relates to improving performance in the context of multi-level cell (MLC) programming, where more than one bit is programmed per cell (such as in the case of floating gate), or per half-cell (such as in the case of NROM and related ONO memory cells). In the main hereinafter, NROM cells having two charge storage (or trapping) areas, or half-cells, may be discussed as exemplary of the techniques disclosed herein.

Multi-level programming may be referred to as "quad" programming as it may, for example, enable programming two bits per NROM half cell (2 bits×2 half cells=4 bits, or "quad"). Multi-level programming may be performed in two phases, as described hereinabove.

According to the disclosure, generally, a cache programming operation which normally uses 2 SRAMs (one for the user and one for the array) may be combined with a multi-level cell (MLC) programming operation which also normally uses 2 SRAMs (one for caching the data and one for verifying the data), using only a total of two SRAMs (or buffers) rather than, for example, 3 or 4 SRAMs.

According to the disclosure, generally, one of the two buffers (User SRAM) receive and store user data. The other of the two buffers (Cache SRAM) may perform a caching function as well as a verify function. In this manner, if a program operation fails, the user can have its original data back so that he can try to reprogram it to a different place (address), or it may read it out to its own buffer and program it to a different place.

According to the disclosure, a method of operating an array of non-volatile memory (NVM) cells may comprise: providing a first buffer (Buffer A) for receiving and temporarily storing original user data coming from a user interface (I/O); providing a second buffer (Buffer B) for performing programming on the array; and with the first and the second buffer, performing both multi-level programming algorithm and cache programming.

Programming may be performed in two phases, a first phase (Phase 1) followed by a second phase (Phase 2). In the first phase, a user may insert data into the first buffer (Buffer A), the data may be copied from the first buffer (Buffer A) to the second buffer (Buffer B), and the array may be partially programmed to get the cells programmed to above a threshold voltage initial level (Vi). In the second phase, re-copying the original data from the first buffer (Buffer A) to the second buffer (Buffer B); determining (pre-verify) which bits need further programming; and further programming the array to get the cells programmed to their desired threshold voltage level.

If the first phase programming fails, notifying the user and starting a new programming session using the same user data being held in the first buffer (Buffer A) to a new address.

When the second phase starts, allowing the user to insert new data into the first buffer (Buffer A).

If the second phase of programming fails, restoring the data to the first buffer (Buffer A).

In the first phase, the data may be scrambled when it is copied from the first buffer (Buffer A) to the second buffer (Buffer B); and if the second phase of programming fails, unscrambling the data before restoring the data to the first buffer (Buffer A).

The first buffer (Buffer A) may comprise SRAM; and the second buffer (Buffer B) may comprise SRAM.

The NVM cells may be selected from the group consisting of floating gate (FG) cells and NROM cells and may be arranged as flash memory.

The techniques disclosed herein may be applicable to most NVM devices including, but not limited to, charge-trapping devices such as NROM (sometimes referred to as Nitride Read Only Memory), SONOS (Semiconductor Oxide Nitride Oxide Semiconductor; Silicon-Oxide-Nitride-Oxide-Silicon), SANOS (Silicon-Aluminum Oxide-Nitride-Oxide-Silicon), MANOS (Metal-Aluminum Oxide-Nitride-Oxide-Silicon), and TANOS (Tantalum-Aluminum Oxide-Nitride-Oxide-Silicon), and also to Floating Gate (FG) devices.

BRIEF DESCRIPTION OF THE DRAWING(S)

Reference will be made in detail to embodiments of the disclosure, examples of which may be illustrated in the accompanying drawing figures (FIGs). The figures are intended to be illustrative, not limiting. Although the disclosure is generally described in the context of these embodiments, it should be understood that it is not intended to limit the disclosure to these particular embodiments.

DETAILED DESCRIPTION

Figure 1A:
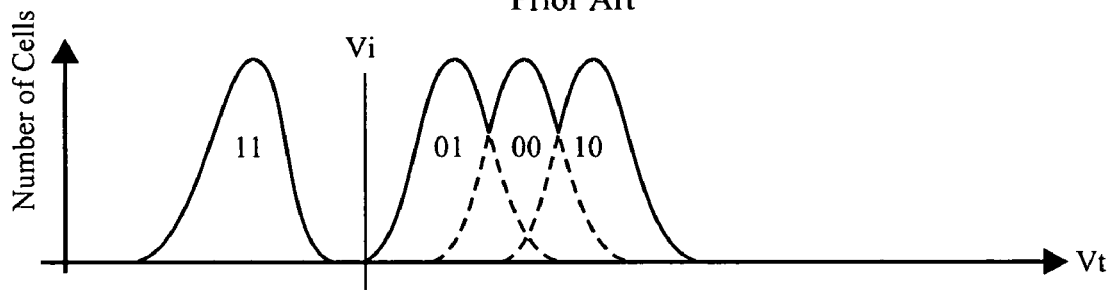
FIGS. 1A and 1B are diagrams illustrating a two phase programming algorithm, according to the prior art.

In the following description, various aspects of techniques for operation of an NVM memory array will be described. For the purpose of explanation, specific configurations and details are set forth in order to provide a thorough understanding of the techniques. However, it will also be apparent to one skilled in the art that the techniques may be practiced without specific details being presented herein. Furthermore, well-known features may be omitted or simplified in order not to obscure the description(s) of the techniques.

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Unless specifically stated otherwise, as apparent from the following discussions, it is appreciated that, throughout the specification, discussions utilizing terms such as "processing", "computing", "calculating", "determining", or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. This apparatus may be specially constructed for the desired purposes, or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs, magnetic-optical disks, read-only memories (ROMs), random access memories (RAMs) electrically programmable read-only memories (EPROMs), electrically erasable and programmable read only memories (EEPROMs), magnetic or optical cards, or any other type of media suitable for storing electronic instructions, and capable of being coupled to a computer system bus.

The processes and displays presented herein are not inherently related to any particular computer or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the inventions as described herein.

Throughout the descriptions set forth in this disclosure, lowercase numbers or letters may be used, instead of subscripts. For example Vg could be written $V_g$. Generally, lowercase is preferred to maintain uniform font size. Regarding the use of subscripts (in the drawings, as well as throughout the text of this document), sometimes a character (letter or numeral) is written as a subscript—smaller, and lower than the character (typically a letter) preceding it, such as "$V_s$" (source voltage) or "$H_2O$" (water). For consistency of font size, such acronyms may be written in regular font, without subscripting, using uppercase and lowercase—for example "Vs" and "H2O".

Although various features of the disclosure may be described in the context of a single embodiment, the features may also be provided separately or in any suitable combination. Conversely, although the disclosure may be described herein in the context of separate embodiments for clarity, the disclosure may also be implemented in a single embodiment. Furthermore, it should be understood that the disclosure can be carried out or practiced in various ways, and that the disclosure can be implemented in embodiments other than the exemplary ones described herein below. The descriptions, examples, methods and materials presented in the description, as well as in the claims, should not be construed as limiting, but rather as illustrative.

Figure 2:
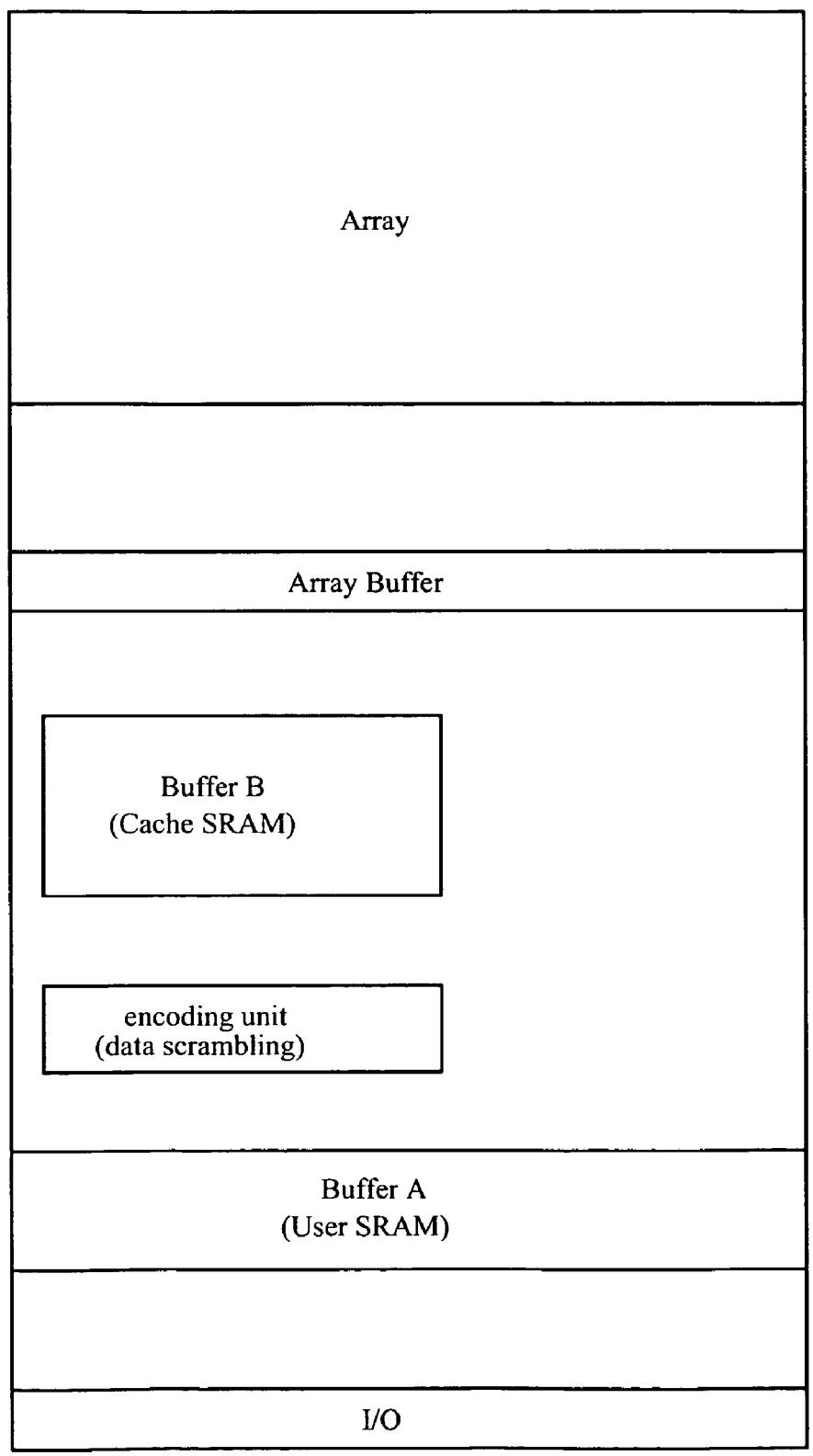
FIG. 2 is a block diagram of an NVM memory array, with internal buffers, according to an exemplary embodiment of the disclosure.

FIG. 2 illustrates an NVM memory array, comprising the following elements:
- a non-volatile memory array ("Array")
- a locally distributed temporary buffer ("Array Buffer")
- a programming algorithm buffer ("Buffer B")
- a data encoding unit ("encoding unit")
- a mirror buffer (Buffer A) for maintaining original user data
- a user interface ("I/O")

The Array may comprise a plurality of NVM memory cells, such as FG or NROM cells, and may comprise (be arranged as) a conventional Flash memory array.

Buffer B may comprise SRAM, and is used for programming the Array, including performing a 2-phase (rough, fine), multi-level (MLC) programming algorithm on the Array.

Buffer B may be referred to as the "programming algorithm buffer", which reflects the fact that the whole programming algorithm may be performed using it (without Buffer A intervention).

Buffer B generally performs the function of Cache SRAM (C-SRAM) as well as Verify SRAM (or "valid" SRAM; V-SRAM). In its dual role as C-SRAM and V-SRAM, Buffer B may be referred to as C/V-SRAM. Buffer B performs what may be referred to as a "logical function".

In its role as C-SRAM, Buffer B receives data provided to it by Buffer A, and provides that data to the Array, as described in greater detail hereinbelow.

In its role as V-SRAM, Buffer B maintains the data being written until it is verified. In its role as C-SRAM, in a 2 phase programming operation, Buffer B maintains data that may be overwritten in Buffer A, for restoring the data to the User-SRAM (Buffer A), as described in greater detail hereinbelow.

Buffer A may be referred to as "mirror buffer" and may comprise SRAM, and its purpose is generally to receive and temporarily store user data coming from the user interface, as described in greater detail hereinbelow. Buffer A may also be referred to as User-SRAM (U-SRAM). Buffer A performs what may be referred to as a "logical function".

The Array Buffer is simply a link between the Array (plurality of NVM cells) and Buffer B. It is internal to the Array, and is generally simply to accommodate timing issues (for example, stall data for one or two clocks between the Array and Buffer B). The Array Buffer is not used for logical functions, as are Buffers A and B.

Figure 3:
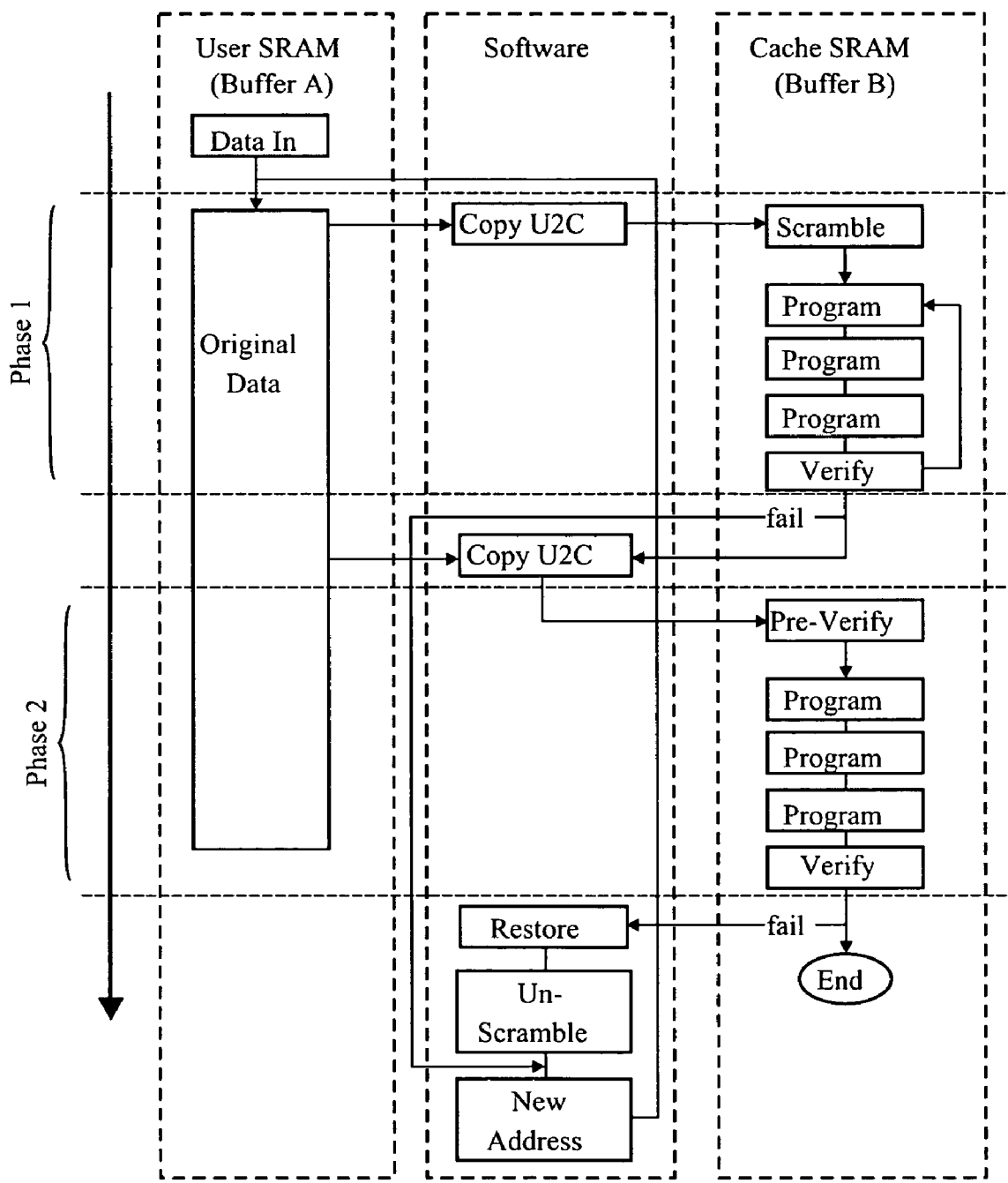
FIG. 3 is a block diagram illustrating an embodiment of operating an NVM memory array, such as shown in FIG. 2, according to the disclosure.

FIG. 3 illustrates an embodiment of a programming algorithm for operating an NVM memory array, such as the memory array shown in FIG. 2, and comprises the following elements:
- a User SRAM (or U-SRAM), also referred to as Buffer A;
- a Cache SRAM (or C-SRAM), also referred to as Buffer B; and
- software ("Software") controlling the operation of the two SRAMs and interfacing to the Array.

The long vertical arrow on the left indicates the flow of time, starting with "Data In" (top left), and ending with "End" (bottom right).

Figure 1B:
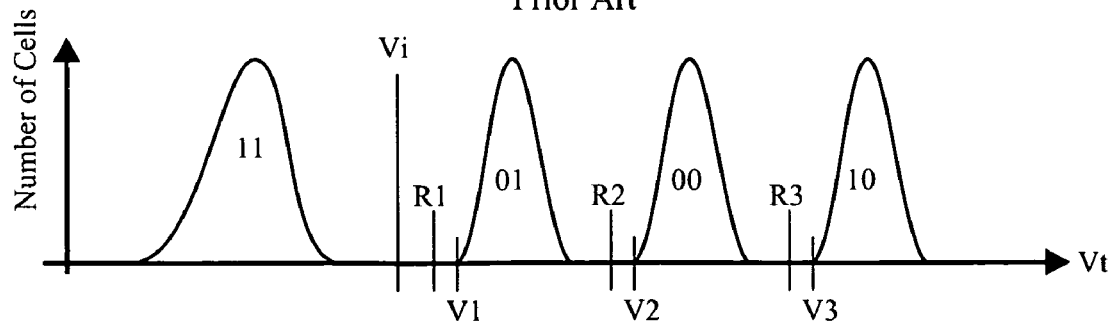

Programming may be performed in two steps, or "phases", such as described hereinabove with respect to FIGS. 1A and 1B. These phases are referred to as "Phase 1" and "Phase 2".

To begin with, a user inserts data ("Data In") to be programmed into the memory array (Array, see FIG. 2). The user data is held (stored) in the User SRAM (Buffer A).

In Phase 1, the user data is copied (Copy U2C) from the User SRAM (Buffer A) to the Cache SRAM (Buffer B). The data, which may be scrambled ("Scramble"), before programming it to the Array, is stored for programming in the Cache SRAM (Buffer B). Then, a conventional cycle of one or more program pulses followed by a verify (read and compare) may be performed to get the cells partially programmed to above an initial level, as discussed hereinabove. (Generally speaking, the Cache SRAM replaces conventional verify SRAM used in cache programming, and the User SRAM performs a more conventional role.)

It should be noted that the scrambling ("Scramble"), although shown in Phase 1, may be done before Phase 1 during a Voltage supply initial stabilization time. Scrambling is, therefore, not part of the actual Phase 1 algorithm. Similarly, the first "Copy U2C" may be done in parallel to the Voltage supply initial stabilization time.

If Phase 1 programming fails ("fail"), the user is informed (notified) and may decide (for example) to start a new programming session (Phase 1 and Phase 2) using the same data to a new address ("New Address"). The data stored in the U-SRAM (Buffer A) is not corrupted. Only the data in the C-SRAM (Buffer B) is corrupted during Phase 1. That is why it is not necessary to do any restoring or recovering mechanism in order to extract the original data out or programming it to another destination. The original data stored, which is already being held in the User SRAM (Buffer A) array, can then be re-sent (re-copied, Copy U2C) to the Cache SRAM (Buffer B), to re-try the Phase 1 programming operation. The user may also choose to read the data out and then start a new sequence of programming with Data In.

If Phase 1 programming is successful, ("normal flow"), at the end of Phase 1, the original data is re-copied (Copy U2C) from the User SRAM to the Cache SRAM, for Phase 2 programming. Re-copying the data is needed since, after the verify operations are completed on the Cache SRAM (Buffer B), the logic operation is such that the Cache SRAM (Buffer B) does not contain the data any more (all bits passed the verify step).

In Phase 2 of the programming, a pre-verify step ("Pre-Verify") may be performed to determine which of the bits need further programming. As mentioned above, in Phase 1, the Vts of some of the bits may already be at the desired program level, and do not need further (Phase 2) programming. Pre-verify is described in FIG. 6.

The "Pre-Verify" combines a copy of the original data to be programmed from the User SRAM to the Cache SRAM (U2C) and logical operation of this data with a data coming from a read of the array at the target Vt level of the cells (VT1, VT2, VT3).

Then, a conventional cycle of one or more program pulses followed by a verify may be performed to get the cells (those that need it) programmed to their desired (target) program level threshold voltages (Vts), as discussed hereinabove.

Once Phase 2 starts (after the Copy U2C is completed), the user can (is allowed to) insert new data to be programmed into the User SRAM (Buffer A). Therefore, the original data stored in the User SRAM will no longer be available. The User SRAM (Buffer A) keeps the user data until the beginning of Phase 2 (after the U2C in Phase 2), after which its data is no longer required and can be written over by the user "next page" information (new data).

If Phase 2 programming fails ("fail"), the data must be restored to the User SRAM (Buffer A). The data must be resorted, because the programming of Buffer A failed, and Buffer A contains only the data of the cells that didn't pass the program. The User SRAM (Buffer A) doesn't contain the original data because the user may already have inserted new data. In a restore step ("Restore") the data is unscrambled (assuming it had been scrambled at the beginning of Phase 1 in the Cache SRAM), and is sent back to the User SRAM as new "data in", with a new address.

The data has to be sent back (unscrambled), because the original data may have been overwritten by new data already.

If Phase 2 programming is successful, the data has successfully been programmed into the array, and the program ends ("End").

The two phase programming operation is shown in greater detail in FIGS. 4, 5, 6 and 7.

Figure 4:
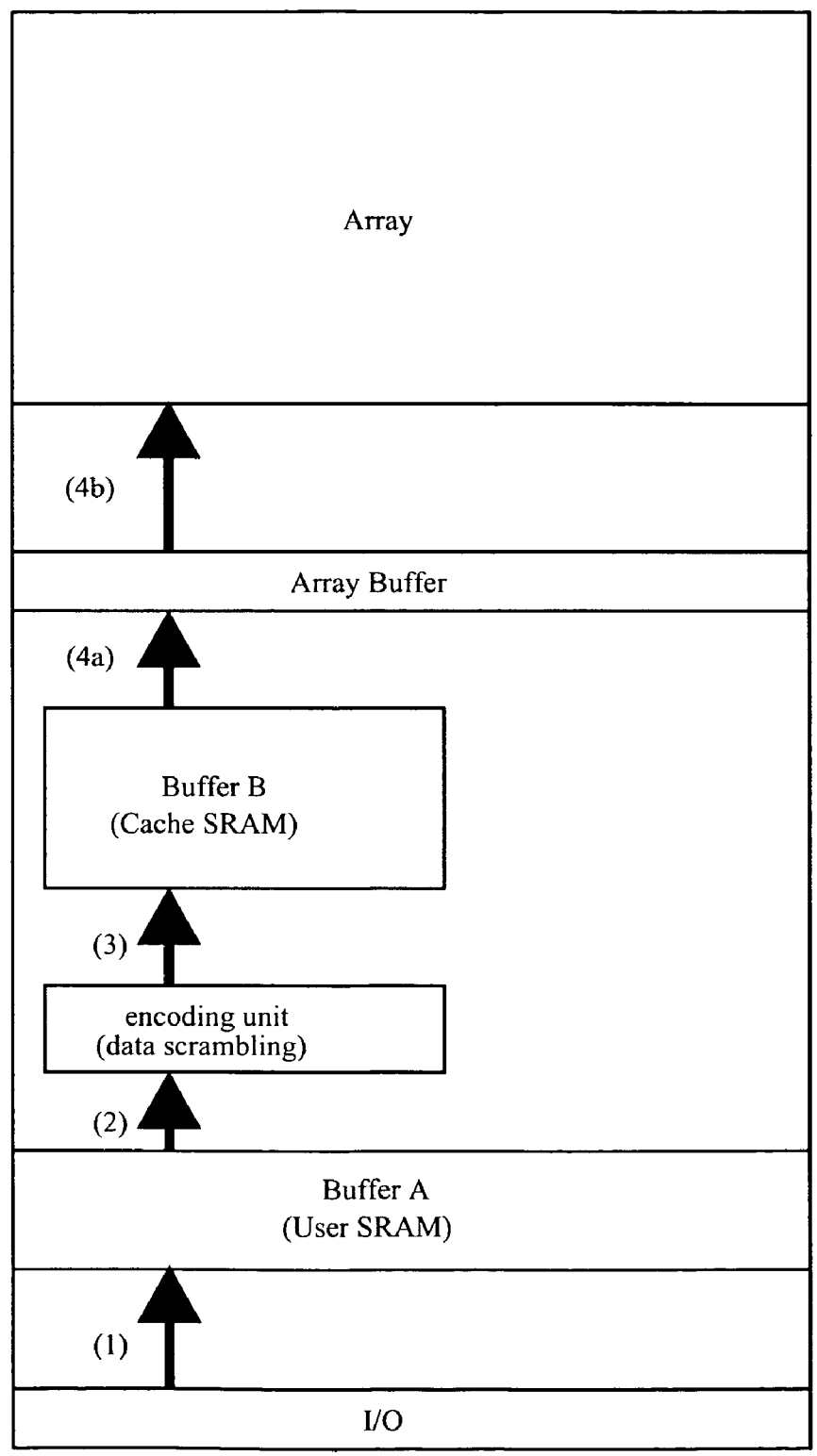
FIG. 4 is a block diagram of the NVM memory array of FIG. 2, illustrating a portion of a program operation, according to the disclosure.

FIG. 4 describes a first part of the first phase (Phase 1) of the programming operation.

In a first step (arrow 1), data is transferred from the user interface (I/O) to Buffer A (User-SRAM; may also be referred to as "mirror SRAM").

In a next step (arrows 2 & 3), the data is transferred from Buffer A to Buffer B. During transfer, the data may be encoded (scrambled).

In a next step (arrows 4a, 4b), the data may be programmed from Buffer B (Cache-SRAM) to the array through the internal Array Buffer (such as for pipelining and timing reasons).

Figure 5:
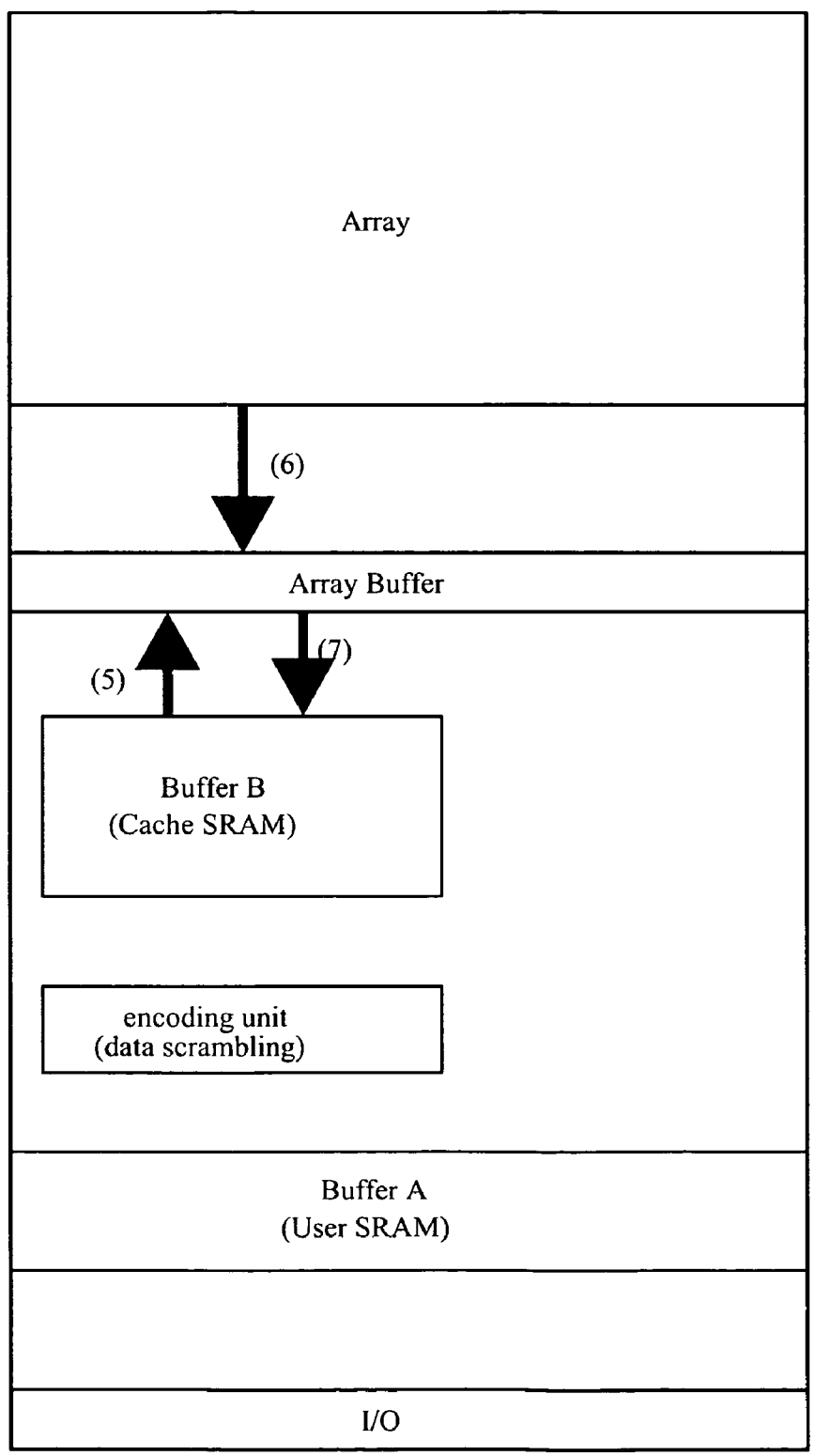
FIG. 5 is a block diagram of the NVM memory array of FIG. 2, illustrating another portion of the program operation, according to the disclosure.

FIG. 5 describes a next part of the first phase (Phase 1) of the programming operation.

In a first step (arrow 5), the data is transferred (for a second time) from Buffer B to the Array (in this case, to the internal Array Buffer). The data that being transferred at arrow 5 is actually the expected data for the verify operation.

Then, in a next step (arrow 6), the data which was programmed (FIG. 13, step 4) to the Array is read from the Array to the internal Array Buffer, and a pass/fail check (verify) is done.

Then, in a next step (arrow 6), the data which was programmed (FIG. 5, and 4) to the Array is read from the Array to the internal Array Buffer, and a pass/fail check (verify) is done.

To summarize, Buffer B can have 2 options. Either it is updated with a '1' on a bit which passed the verify (no need to program any more) or it keeps its original data ('0' if this bit requires programming) in case of verify that failed.

Notice that the data is sent twice from Buffer B to the Array. The first time (FIG. 4, step 4) to program the Array, the second time (FIG. 5, step 5) to verify the programming.

It should be noted that in the context of 2 bits per cell (2 b/c), there is no need to send the expected data during the verify operation since the V-SRAM keeps this information already. There are generally only 2 options: either a bit needs to be programmed ('0') or not ('1'). In MLC (4 b/c) it is important where this bit needs to be programmed ('01' or '00' or '10'), and since the CSRAM only keeps pass/fail, the expected level data information must be sent into the array buffer and there to do a comparison if, for example, a bit that was meant to be programmed to '00' passed its Vt target or not. If it does, then the CSRAM gets 1 bit indicating it is a pass (irrespective of its level '00').

Regarding phase 1 of the programming operation (FIGS. 4 and 5), the program operation and the verify operation may not finish with one pulse. Therefore, the operation of program and verify may be iterative until the phase is done, or timeout is reached (indicating that the operation failed).

Figure 6:
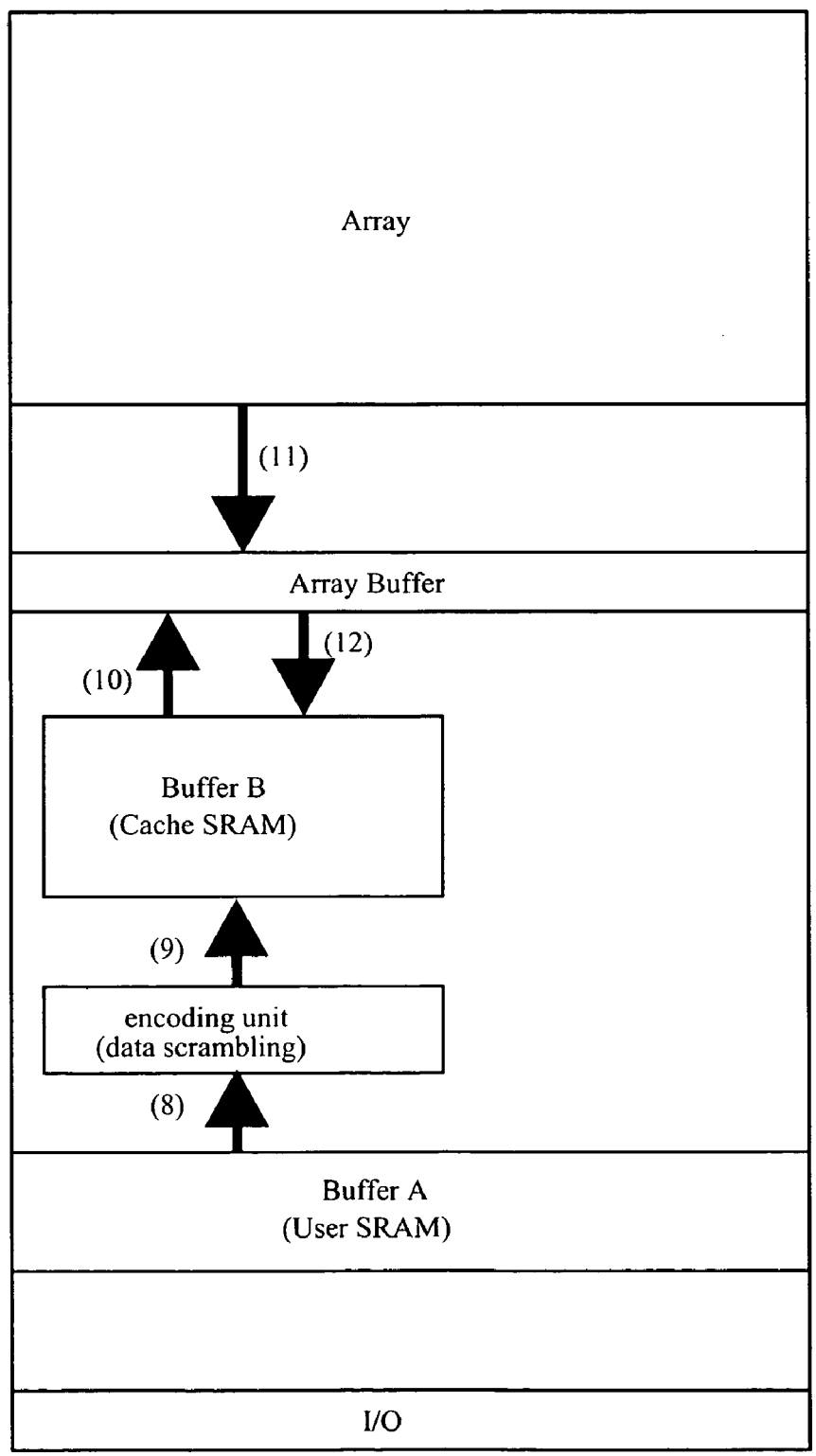
FIG. 6 is a block diagram of the NVM memory array of FIG. 2, illustrating another portion of the program operation, according to the disclosure.

FIG. 6 describes a first part of the second phase (Phase 2) of the programming operation. The following "pre-verify" steps are performed after the Phase 1 programming (FIG. 4) and verify (FIG. 5) are complete.

Generally, the goal of "pre-verify" is to determine which of the bits still need to be programmed. It could be (in some cases) that after the first phase (Phase 1) that the Vt of the bit is already programmed above the target, and there is no need to program it in the second phase (Phase 2).

In a first step (arrows 8 & 9), the original data is re-generated from Buffer A to Buffer B, through the data encoding unit.

In a next step (arrow 10), the expected data (levels) are sent to the internal Array Buffer so that it can be determined which bits already passed their target by doing the verify operation.

In a next step (arrows 11 & 12), data is read from the Array to Buffer B, through the internal Array Buffer.

In this step, data is transferred back to Buffer B.
  a. if passed, the data is reset. This may be done by resetting the mask in SRAM, which indicates that programming is not necessary because selected bits are already at target, already programmed. In other words, some of the Phase 1 bits may be finished, and are taken out of the mask.
  b. if fail, the original data is re-fetched. The logical operation on the CSRAM is such that if the verify failed, it just leaves there the original data that was re-fetched on the $2^{nd}$ U2C (at the beginning of Phase 2).

Figure 7:
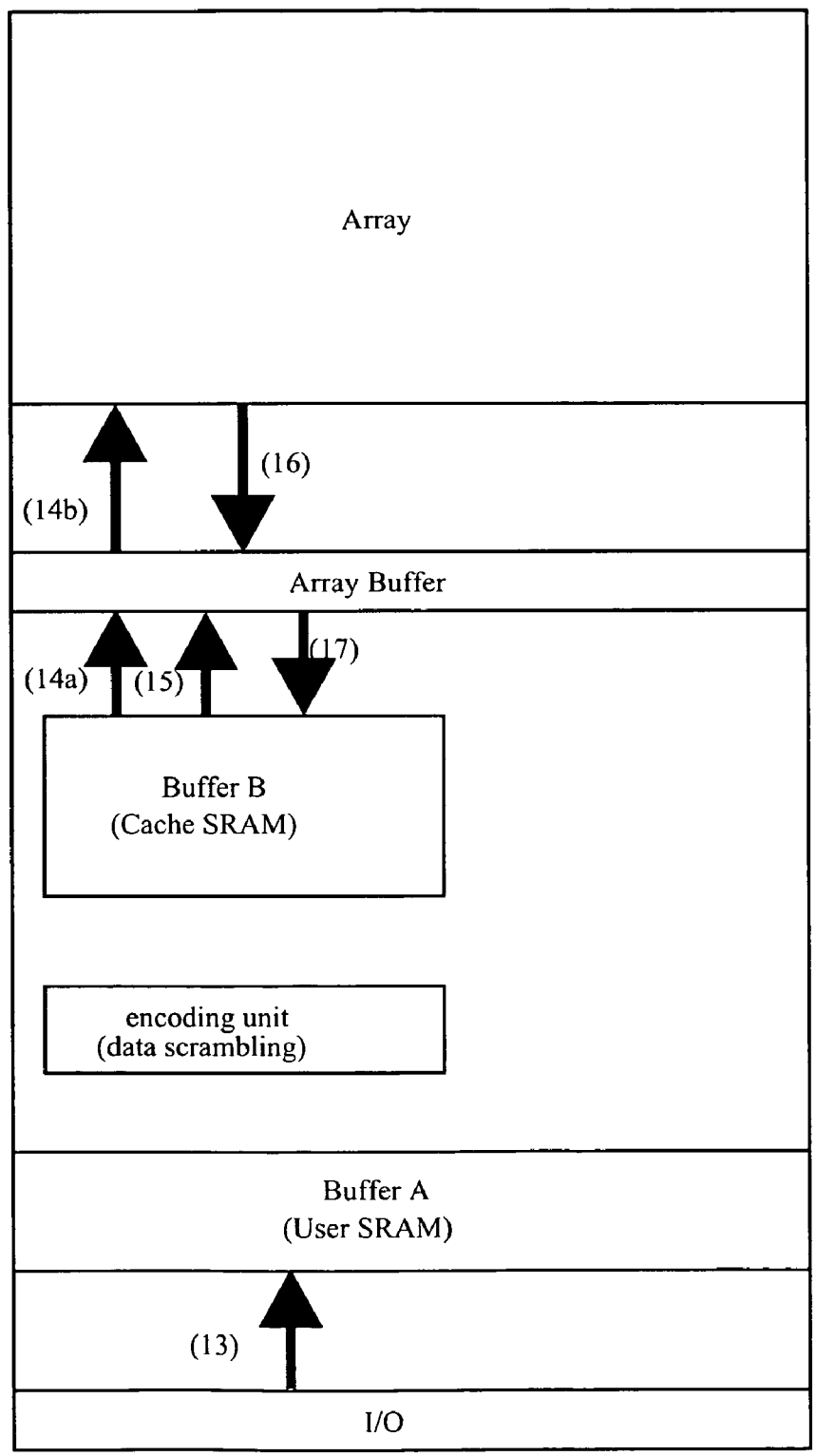
FIG. 7 is a block diagram of the NVM memory array of FIG. 2, illustrating another portion of the program operation, according to the disclosure.

FIG. 7 illustrates the program operation for Phase 2. As indicated above, only some of the bits need Phase 2 programming.

Phase 1 is finished, and Buffer A has finished its program algorithm. Therefore, while Buffer B is handling the Phase 2 programming of previous data, the user can insert new data, such as a next page of data, into Buffer A. In a manner similar to the first step of Phase 1 of the current programming operation (see FIG. 4, arrow 1), in a first step (arrow 13) of a next programming operation (only the first step is described herein), data is transferred from the user interface (I/O) to Buffer A.

The Phase 2 programming steps shown here are similar to the Phase 1 programming steps shown in FIG. 4 (program) and FIG. 5 (verify).

In a first step (arrows 14a and 14b, compare FIG. 4, arrows 4a and 4b), the data may be programmed from Buffer B (Cache-SRAM) to the Array.

In a next step (arrow 15, compare FIG. 5, arrow 5), the data is transferred (for a second time) from Buffer B to the Array (in this case, to the internal Array Buffer).

Then, in a next step (arrow 16, compare FIG. 5, arrow 6), the data which was programmed (FIG. 4, step 4) to the Array is read from the Array to the array buffer, and a pass/fail check (verify) is done.

Then, in a next step (arrow 17, compare FIG. 5, arrow 7), the data is transferred back to Buffer B, and there are two possibilities:
  a. if programming passed, the data in Buffer B is reset. Buffer A is already containing (or in the process of getting) the new user data for the next page.
  b. if programming failed, the original data is re-fetched. If a programming fails during the $2^{nd}$ phase, it is necessary to do a recovery (restore), as described with respect to FIG. 3.

This means that data that is in the array is read, and with a logical operation done on the Cache SRAM, the complete data that the user intended to program is recovered. It should be noted that until a bit passes verify, it contains in the Cache SRAM the original data of the user, so with these bits there is no problem, but as for the other bits that the user had in his data, these are extracted from the array by a simple read operation from the array and a complex logical operation on the Cache-SRAM.

FIGS. 3-7 have illustrated an example of multi-level (2 phase), cache programming. Generally, Buffer B (Cache-SRAM) is always working with Array, and Buffer A (User-SRAM) is always working with user.

Figure 8:
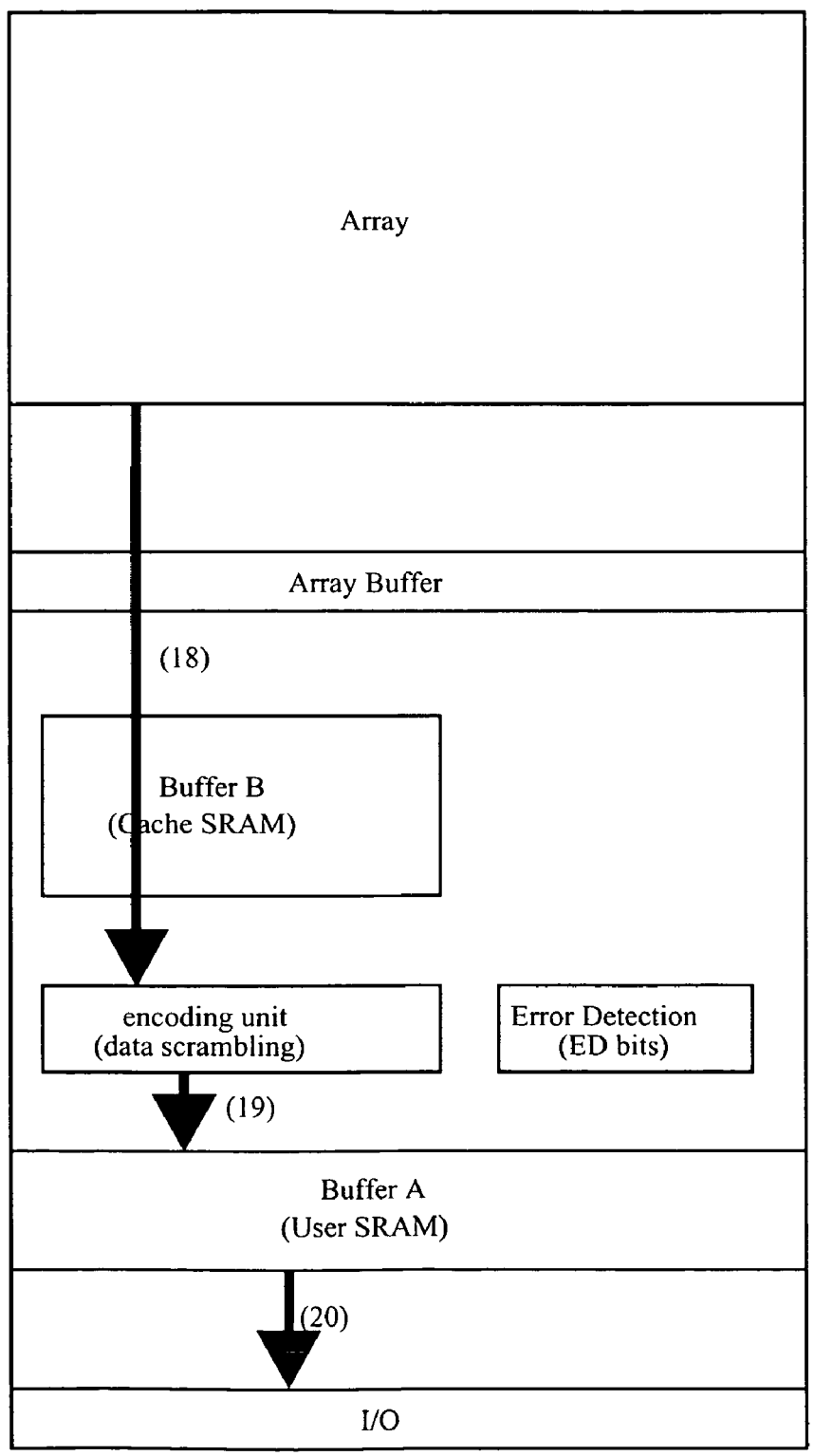
FIG. 8 is a block diagram of the NVM memory array of FIG. 2, illustrating a read operation, according to the disclosure.

FIG. 8 illustrates a read operation, reading data from the Array.

In a first step (arrow 18), data is transferred from the Array to the encoding unit. The data does not need to go through the array buffer, and does not need to go through Buffer B.

In (or in conjunction with) the encoding unit, data integrity validation may be performed, such as by using error detection (ED) techniques and ED bits that may be stored (in the Array) along with the data.

In a next step (arrow 19), the data is transferred from the encoding unit to Buffer A, and in a final step (arrow 20) the data is transferred from Buffer A to IO While a number of exemplary aspects and embodiments have been discussed above, those of skill in the art will recognize certain modifications, permutations, additions and sub-combinations thereof. It is therefore intended that the following appended claims and claims hereafter introduced be interpreted to include all such modifications, permutations, additions and sub-combinations.

What is claimed is:

1. A non-volatile memory ("NVM") device comprising a first buffer adapted to receive data from an interface;
   a second buffer adapted to receive data derived from data in said first buffer; and
   control logic adapted to program an NVM array using data in said second buffer, wherein programming of the NVM array includes modifying data in said second buffer during a first phase of programming and refreshing data in said second buffer with at least some data from said first buffer prior to a second phase of programming.

2. The device according to claim 1, wherein said first buffer is adapted to receive data from the external interface while said control logic is engaged in a second phase of programming.

3. The device according to claim 1, wherein said first buffer is comprised of SRAM.

4. The device according to claim 1, wherein said second buffer is comprised of SRAM.

5. The device according to claim 1, wherein, as a part of the first phase of programming, said control logic is adapted to initiate a cycle of programming pulses followed by program verify operations.

6. The device according to claim 5, wherein said control logic is adapted to terminate a first phase of programming once NVM cells in the NVM array reach a first given threshold voltage.

7. The device according to claim 6, wherein said control logic is adapted to initiate a second phase of programming in order to raise the threshold voltage of NVM cells in the NVM array to a second given threshold voltage greater than the first given threshold voltage.

8. The device according to claim 1, wherein said control logic is adapted, in the event the first phase programming fails, to initiate another first phase programming session by refreshing the said second buffer with data derived from data in said first buffer and programming a new NVM array address.

9. The device according to claim 1, wherein said control logic is further adapted to scramble data being written to said second buffer from said first buffer.

10. The device of claim 1, wherein the NVM cells are selected from the group consisting of floating gate (FG) cells and charge trapping type cells.

11. The device of claim 1, wherein the NVM array is a flash memory.

12. A method of programming a non-volatile memory ("NVM") device comprising:
   placing data in a first buffer;
   placing data in a second buffer derived from data in the first buffer; and
   programming an NVM array using data in said second buffer, wherein programming of the NVM array includes modifying data in said second buffer during a first phase of programming and refreshing data in said second buffer with at least some data from said first buffer prior to a second phase of programming.

13. The method according to claim 12, further including receiving data from an external interface while during second phase of programming.

14. The method according to claim 12, wherein the first phase programming includes a cycle of programming pulses followed by program verify operations.

15. The method according to claim 14, including terminating a first phase of programming once NVM cells in the NVM array reach a first given threshold voltage.

16. The method according to claim 15, including initiating a second phase of programming in order to raise the threshold voltage of NVM cells in the NVM array to a second given threshold voltage greater than the first given threshold voltage.

17. The method according to claim 12, wherein said control logic is adapted, in the event the first phase programming fails, to initiate another first phase programming session by refreshing the said second buffer with data derived from data in said first buffer and programming a new NVM array address.

* * * * *